United States Patent [19]

Osada et al.

[11] 4,297,470

[45] Oct. 27, 1981

[54] IMAGE FORMING PROCESS

[75] Inventors: Chiaki Osada; Masato Satomura; Hisatake Ono, all of Asaka, Japan

[73] Assignee: Fuji Photo Film Co., Ltd., Kanagawa, Japan

[21] Appl. No.: 439,685

[22] Filed: Feb. 4, 1974

Related U.S. Application Data

[63] Continuation of Ser. No. 212,530, Dec. 27, 1971, abandoned.

[30] Foreign Application Priority Data

Dec. 26, 1970 [JP] Japan .................................. 45/118984

[51] Int. Cl.³ ........................ C08F 20/26; C08F 20/58
[52] U.S. Cl. ..................................... 526/304; 526/321; 526/323.1; 526/323.2; 430/287

[58] Field of Search ...................... 526/304, 321, 323.1; 525/292, 359

[56] References Cited

U.S. PATENT DOCUMENTS 3,486,932 12/1969 Schaper et al. ..................... 526/304
3,867,318 2/1975 Nishikubo et al. .................. 525/404

*Primary Examiner*—Edward J. Smith
*Attorney, Agent, or Firm*—Sughrue, Mion, Zinn, Macpeak & Seas

[57] ABSTRACT

A process for forming an image comprising image-wise exposing a support having thereon a cinnamoyl group containing light-sensitive polymers containing at least 64 mol % of cinnamoyl groups is disclosed.

4 Claims, 1 Drawing Figure

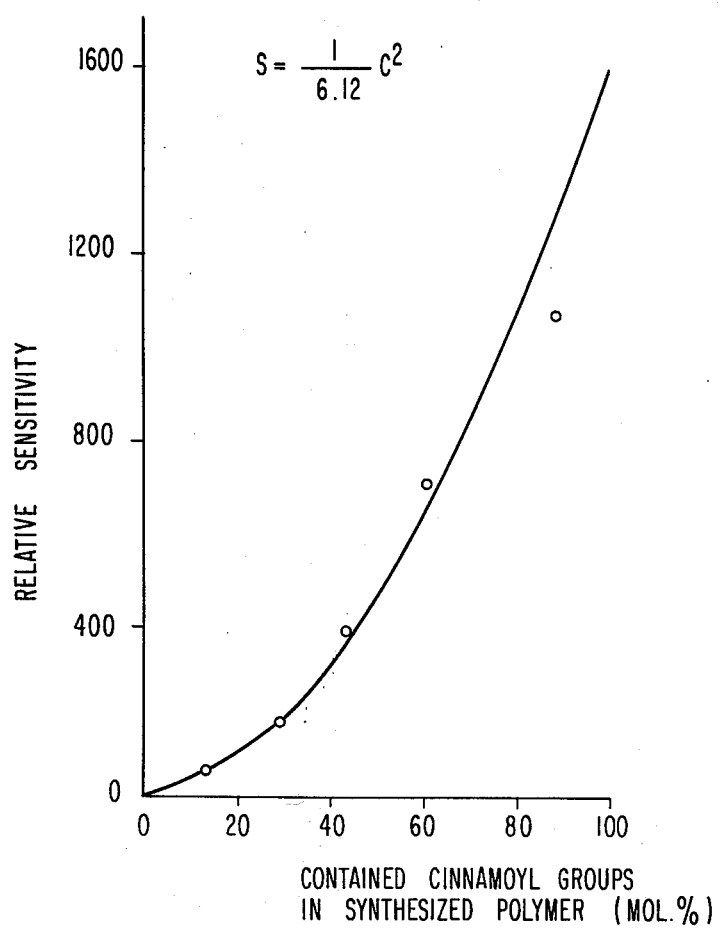

IMAGE FORMING PROCESS

This is a continuation of application Ser. No. 212,530, filed Dec. 27, 1971 now abandoned.

BACKGROUND OF THE INVENTION

1. Field of the Invention

The present invention relates to a process for forming images which comprises utilizing the photosensitive properties of a high molecular weight substance which is synthesized by homopolymerizing a monomer having two different kinds of functional groups which have different reactivity, that is, an acryloyl or methacryloyl group and a cinnamoyl group, or copolymerizing such monomer.

2. Description of the Prior Art

Hitherto, it has been known that cinnamic acid and esters thereof cause a photo-cross linking reaction by the action of rays to form a cyclobutane ring. Further, processes for forming images which comprise utilizing changes in solvent resistance and hardness by such a photo-cross linking reaction have also been examined. For example, see "Light Sensitive Systems", page 140, written by J. Kosar, published by John Wiley & Sons Co., 1965.

However, as described in detail in the above-mentioned reference, prior processes for the synthesis of photo cross-linkable materials have been carried out by a method which comprises producing an ester from polyvinyl alcohol having hydroxyl groups on the main chain as the starting material. This is a process for producing a polymer which has properties different from the starting material by reacting polyvinyl alcohol having reactive groups with another reagent, which is generally called a high molecular weight reaction. However, this reaction does not proceed quantitatively at the introduction of the active groups into the high molecular weight substance because of the so called high molecular weight effect. (Refer to, for example, 1. "Chemical Reactions of Polymers", page 1, written by E. M. Fettes, published by Interscience Pub. 1964; and 2. "Kindai Kogyo Kagaku" No. 16, a first volume, page 365, written by Iwakura et al, published by Asakura-shoten, 1966).

The relationship shown in the drawing between the degree of substitution of a polymer into which cinnamic acid groups are introduced by the above-mentioned high molecular weight reaction and the ease of photo-cross linking is known. It is thus expected to synthesize a polymer containing cinnamoyl groups, in other words, a polymer having a reactive group per monomer unit of the synthesized polymer.

Much research has been done on the above system. For example, G. Smets, R. Hart and Kawai have individually examined the polymerization of vinyl monomers having a cinnamoyl group (vinyl cinnamate). However, according to their research, while vinyl cinnamate is easily subjected to ring-polymerization the produced polymer contains only approximately 20% cinnamic acid groups, and the polymer becomes insoluble in solvents because of gelation if the degree of polymerization of the polymer is raised so much. Recently, Kato examined polymers into which —O—$C_2H_4$ or

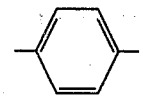

was introduced between the vinyl group and the cinnamoyl group and synthesized such polymers by a cationic polymerization reaction. However, a polymer having a high molecular weight cannot be obtained by a radical polymerization using this process. (Refer to, for example, "Polymer Sci." B(7) 605 by Kato (1969)).

G. Smets et al tried to synthesize the light sensitive resin directly from the radical polymerization, subsequent to synthesizing a cinnamic acid vinyl monomers.

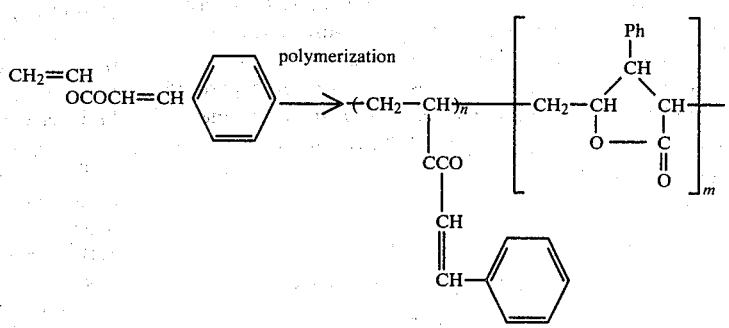

The polymerization is mainly proceeded in the ring mechanism and only those having low light sensitivity are obtained due to the small amount of cinnamic acid groups residing on the main chain of the polymer. In the process of the present invention, there can be obtained those having an excellent light sensitivity due to the cinnamic acid totally residing therein.

Kato et al produces the light sensitive resin in accordance with the following reaction system.

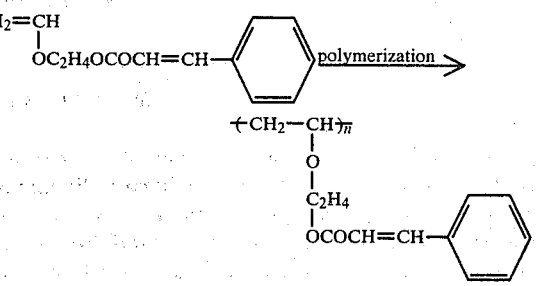

In the radical polymerization, the intrinsic viscosity does not rise and those having low light sensitivity are obtained.

In accordance with the process of the present invention, the radical polymerization quickly proceeds and there is obtained resins having high light sensitivity.

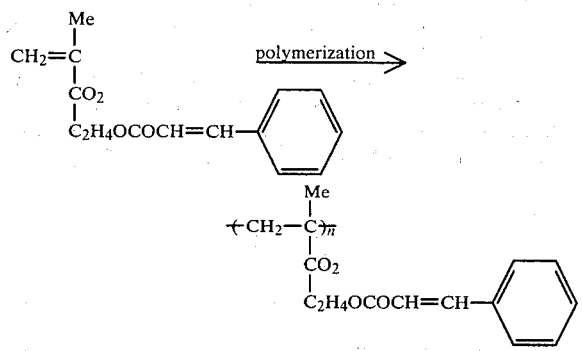

BRIEF DESCRIPTION OF THE DRAWING

The drawing is a graph which illustrates the relationship between the degree of substitution of a polymer into which cinnamic acid groups are introduced and the relative sensitivity thereof.

SUMMARY OF THE INVENTION

In the present invention, an acryl or methacryl group is utilized as the addition polymerizable group. Hitherto, though compounds having two different esters in the molecule have not been examined so much, we have synthesized utilizing monoesters having a hydroxyl group by the present invention. For example, the monomer of the Synthesis example 1 shows the reaction formula as follows:

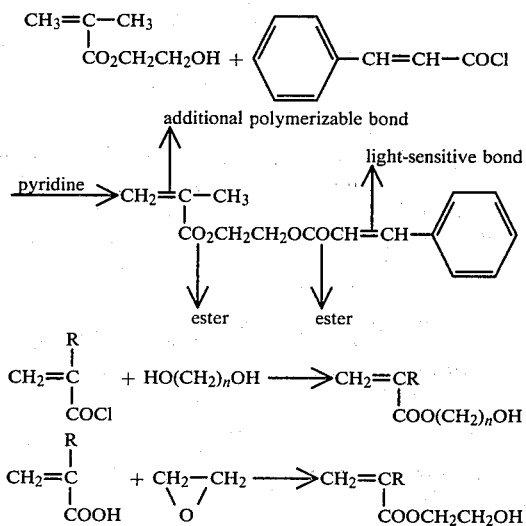

wherein R is a hydrogen atom or methyl group, n is an integer of 1 to 6. The additional polymerizable monomer having a hydroxyl group obtained by the above reaction is reacted with cinnamic acid chloride in the presence of a base such as pyridine to easily produce additional polymerizable monomer having a cinnamoyl group. Further, it is possible to practice amidation and esterification in turn utilizing the difference of reactivity of the amino group and the hydroxy group.

The monomer and synthesized polymer thereof in this invention are new compounds. The monomer having has the following general formula:

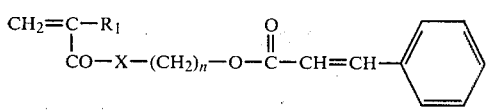

wherein X is an oxygen atom or —NH, $R_1$ is a hydrogen atom or an alkyl group having 1 to 6 carbon atoms, n is an integer of 1 to 6.

Light-sensitive polymer of this invention is obtained by polymerization or copolymerization of the above monomer.

As the starting substance, alkylene glycols, alkylene oxides, polyalkylene oxides, glycidyl alcohols, alkanolamines, aminophenols, aliphatic or aromatic diols, amino alcohols and oxides can be used. Reagents having a reactive group which can be esterified such as hydroxypropyl acrylate, ethylene glycol methacrylate, diethylene glycol methacrylate and N-methylol acrylamide are effectively utilized in the present invention and are available easily. Cinnamoylation can be carried out by common methods. The cinnamoyl group in the polymer is 65 mol% to 100 mol%, preferably 80 mol% to 100 mol%.

The molecular weight of the polymer is 5000 to 30,000, preferably 10,000 to 15,000.

The resulting addition polymerizable monomer can be subjected to homopolymerization or copolymerization with desirable monomers so as to increase the solubility, adhesive property or compatability to other resins and pigments.

The comonomer is a radical polymerizable vinyl monomer. For example, styrene, acrylic acid ester, methacrylic acid ester, acrylonitryl, acrylic acid, methacrylic acid, acrylamide, diacetoneacrylamide, and the like.

The amount of monomer copolymerizable with the monomer having acryloyl or methacryloyl and cinnamoyl groups is preferably less than 35 mol%.

The copolymer is a random type polymer.

As the sensitizer, aromatic nitro compounds and aromatic ketones which are sensitizers commonly used for cinnamic acid esters can be used as the photosensitive part is the cinnamoyl group. The sensitizer actually used includes, for example 2,4,7-trinitro-9-fluorenone, 5-nitroacenaphthene, picramide, p,p'-tetramethylaminobenzophenone, 1-acetylamino-4-nitro-naphthalene, and the like.

The amount of sensitizer in the polymer is 3 to 10 wt.%, preferably 5 to 7 wt.%.

Furthermore, since monomers are the starting materials in the present invention, sensitizing monomers can be introduced directly into the high molecular weight chain by copolymerization. In polymerization, various initiators can be used. But it is an important characteristic that a polymer which does not contain metal ions, can be obtained since all reagents used are organic substances, for example, in Synthesis example 2. The compound of this invention is obtained by radical polymerization, and did not use metal, such as sodium-naphthalene, for the cationic polymerization catalyst.

The polymerization initiators of this invention are N,N'-azobisisobutyronitrile, benzoyl peroxide, lauryl peroxide, and the like.

Photosensitive high molecular weight compounds according to the present invention can be used for producing offset printing plates, as photoresists and in other applications the same as for prior art polycinnamic acid ester derivatives.

Average reaction conditions are:

Molar ratios: 65 to 100 mol%.
Catalysts: 0.5 to 1.2 mol% in based on the monomer.
Temperature: 50° to 75° C., preferably 60° to 65° C.
Time: 3 to 15 hours, preferably 6 to 8 hours.
Pressure: Normal pressure in a nitrogen gas atmosphere.

The polymers utilized in the present invention can have monomer units, for example, as shown in Formulas I and II as the photosensitive group:

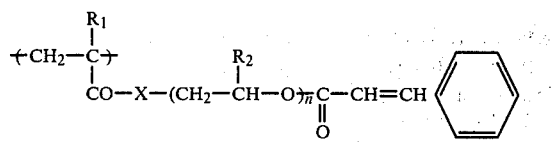

wherein
X: O or NH
$R_1$ and $R_2$: H or lower alkyl having 1-6 carbon atoms
n: integer of 1-4.

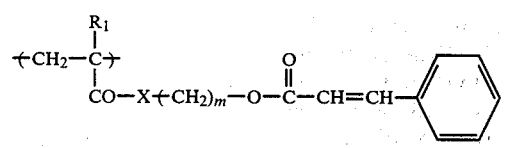

wherein
X: O or NH
$R_1$: H or lower alkyl having 1-6 carbon atoms.
m: integer of 1-6.

Among these, polymers composed of monomer units represented by the following formula are especially preferred.

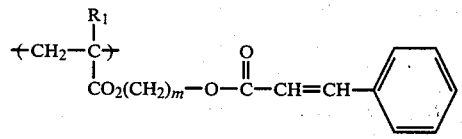

wherein $R_1$: hydrogen or lower alkyl having 1-6 carbon atoms.
m: integer of 2-6.

The following are representative of syntheses within the present invention.

SYNTHESIS EXAMPLE 1

19 g of β-hydroxyethyl methacrylate was dissolved in 46 g of pyridine. 25 g of cinnamic chloride was gradually added thereto with vigorous stirring while cooling the reactor with ice water. After concluding the addition, the reaction was continued for 8 hours at room temperature to complete the reaction. After the reaction was over, the mixture was put into 200 ml of water. The separated liquid was extracted by ether. The separated liquid is a non-water soluble oily material, that is, product. The ether layer was then sequentially washed with a dilute aqueous solution of hydrochloric acid and water. The ether layer was dried with anhydrous Glauber's salt. After filtering, ether was removed by distillation under reduced pressure without heating. The filtration removed the Glauber's salt. 33 g of a light yellow liquid substance was thus obtained. As a result of elemental analysis, infrared ray absorption analysis and nuclear magnetic resonance spectrum analysis, the resulting liquid substance was confirmed to be β-cinnamoyloxyethyl methacrylate.

| Elementary Analysis | Measured Value (%) | Calculated Value (%) |
|---|---|---|
| C | 70.01 | 69.21 |
| H | 6.22 | 6.20 |

| NMR Spectrum Absorption Value | Proton | Number of Hydrogen Atom |
|---|---|---|
| 7.4 ppm | Benzene ring proton | 5 |
| 7.6 ppm, 6.35 ppm | Olefin proton | 2 |
| 6.05 ppm, 5.5 ppm | Vinyl proton | 2 |
| 4.3 ppm | Methylene proton | 4 |
| 1.9 ppm | Methyl proton | |

Infrared ray absorption spectrum
Absorption of ester at 1720 and 1730 cm$^{-1}$

SYNTHESIS EXAMPLE 2

8 g of the β-cinnamoyloxyethyl methacrylate obtained in Synthesis Example 1 was dissolved in 55 g of tetrahydrofuran. After adding 100 mg of azobisisobutyronitrile, the solution was stirred for approximately 3 hours in a nitrogen gas atmosphere. After the reaction was over, the reaction solution was added dropwise to n-hexane to precipitate a white polymer. By filtration, 6.5 g of a polymer was obtained. The resulting compound was poly- β-cinnamoyloxyethyl methacrylate. The above compound had the following formula:

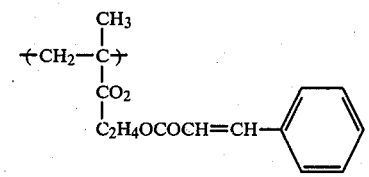

Intrinsic viscosity was [η]sp/c=0.580 dl/g.
Infrared ray absorption spectrum:
Absorption of ester at 1720 and 1730 cm$^{-1}$.
The reaction temperature in Synthesis Example 2 and Example 3 is 65° C.

SYNTHESIS EXAMPLE 3

8 g of the β-cinnamoyloxyethyl methacrylate obtained in Synthesis Example 1 and 2 g of ethyl methacrylate were dissolved in 90 g of tetrahydrofuran. After adding 10 mg of azobisisobutyronitrile, the solution was refluxed while stirring under a nitrogen gas atmosphere. After reacting for approximately 4 hours, the reaction product was put into 1 liter of n-hexane to precipitate a polymer. By filtration and drying, approximately 9.2 g of a white polymer was obtained. Intrinsic viscosity of this compound was [η]sp. c=0.620 dl/g. The properties of this compound were similar to these of the poly-β-cinnamoyloxyethyl methacrylate prepared in Synthesis Example 2.

EXAMPLE 1

To a 20% methylethylketone solution of the poly-β-cinnamoyloxyethyl methacrylate prepared in Synthesis Example 2, 3%, 2,4,7-trinitro-9-fluorenone in the light-sensitive polymer was added to produce a homogeneous solution. The solution was applied to a polyethylene terephthalate film 50μ thick. After drying, the coating layer was approximately 4μ thick. The resulting element was laid onto a photographic negative and exposed to light for 120 seconds by a mercury lamp (Toshiba SHL-100 UV) at a distance of 15 cm. The film was then washed with acetone, by which the polymer on the unexposed part was removed by dissolution and only the exposed part became insoluble. A transparent relief image was thus produced.

EXAMPLE 2

A solution prepared by adding 2% by weight based on the polymer of 5-nitroacenaphthene to a 20% methylethylketone solution of the poly- β-cinnamoyloxyethyl methacrylate produced in Synthesis Example 2 was applied to a presensitized printing aluminum plate which was treated with zirconium fluoride to have a hydrophilic property. After drying, the coated layer was approximately 15μ thick. The resulting film was then laid onto a photographic negative and exposed to light for 2 minutes using a PLANO PS PRINTER A 3 (produced by Fuji Photo Film Co.). By removing polymer on the unexposed part, a distinct image was obtained. When printing was practiced using the resulting printing plate, an ink and a wetting agent by means of the common offset printer, the printing plate exhibited excellent copying properties and printed matters having a distinct image could be obtained.

EXAMPLE 3

The same solution as in Example 2 was applied to a polyester base having a 50μ thickness which has been subjected to copper electroplating. After drying, the coating film was 12μ thick. The resulting sheet was laid onto a photographic negative and exposed to light for 90 seconds at a distance of 15 cm by a mercury lamp (Toshiba SHL-100 UV). Upon washing the film with tetrahydrofuran, the polymer on the unexposed part was removed by dissolution and the polymer on the exposed part remained as an insoluble image. The film was then treated with a 35% aqueous solution of ferric chloride, by which copper on the uncoated part was removed and an image was obtained in which the copper was protected by the insoluble polymer.

SYNTHESIS EXAMPLE 4

The following results are obtained by same process of Synthesis Example 2.

TABLE 1

| Synthesis Example No. | Cinnamoyl Monomers | Monomer used copolymerization (g) | [η]sp/c (dl/g) |
| --- | --- | --- | --- |
| 4 | 8 | methylmethacrylate 2g | 0.230 |
| 5 | 8 | acrylamide 1g | 0.127 |
| 6 | 8 | styrene 2g | 0.315 |

What is claimed is:

1. A process for producing photosensitive homopolymers containing the recurring unit:

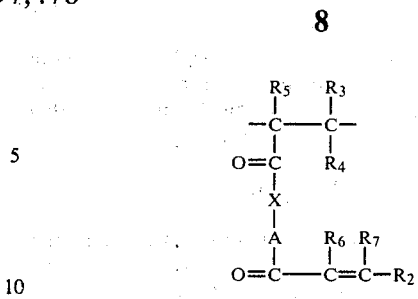

wherein A is:

$-(-CH_2CH-O-)_m-$ or $-(-CH_2-)_m-O$
         |
         $R_8$ wherein $R_8$ is a hydrogen atom or an alkyl group having 1 to about 6 carbon atoms, n is the integer of 1, m is an integer or from 1 to 6;

$R_2$ is:

[benzene ring structure]

$R_3$ and $R_4$ are each hydrogen:
$R_5$ is a hydrogen atom or an alkyl group having from 1 to about 6 carbon atoms:
$R_6$ is a hydrogen atom: X is —O— or —NH—
$R_7$ is hydrogen, which process comprises preparing a mixture containing a monomer represented by the general formula:

$$\begin{array}{c} R_2 \quad R_3 \\ | \quad\quad | \\ C=\!=\!C \\ | \quad\quad | \\ O=C \quad R_4 \\ | \\ X \\ | \\ A \quad R_6 \quad R_7 \\ | \quad\quad | \quad\quad | \\ O=C\!-\!-\!C=C-R_2 \end{array}$$

wherein A, X, $R_2$, $R_3$, $R_4$, $R_5$, $R_6$ and $R_7$ are as defined above, and a polymerization initiator under an inert atmosphere; and holding said mixture under an inert atmosphere for time sufficient for the polymer to form.

2. A process as set forth in claim 1 wherein the mixture containing the monomer also contains an organic solvent.

3. A process for producing photosensitive copolymers containing at least about 65 mol percent of the recurring unit:

$$\begin{array}{c} R_5 \quad R_3 \\ | \quad\quad | \\ -C\!-\!-\!C- \\ | \quad\quad | \\ O=C \quad R_4 \\ | \\ X \\ | \\ A \quad R_6 \quad R_7 \\ | \quad\quad | \quad\quad | \\ O=C\!-\!-\!C=C-R_2 \end{array}$$

wherein A is:

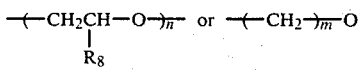

wherein $R_8$ is a hydrogen atom or an alkyl group having 1 to about 6 carbon atoms, n is the integer of 1, m is an integer of from 1 to 6;

$R_2$ is:

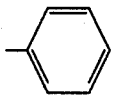

$R_3$ and $R_4$ are each hydrogen;
$R_5$ is a hydrogen atom or an alkyl group having from 1 to about 6 carbon atoms;
$R_6$ is hydrogen; X is —O— or —NH— and
$R_7$ is hydrogen,
which process comprises preparing a mixture containing a monomer represented by the general formula:

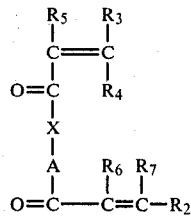

wherein A, X, $R_2$, $R_3$, $R_4$, $R_5$, $R_6$ and $R_7$ are as defined above, a comonomer copolymerizable therewith and a polymerization initiator under an inert atmosphere, the total proportion of said comonomer not exceeding about 35 mol percent per 65 mol percent of said photosensitive monomer; and holding said mixture under an inert atmosphere for a time sufficient for the polymer to form.

4. A process as set forth in claim 3 wherein the mixture containing the monomer also contains an organic solvent.

* * * * *